United States Patent [19]

Pathak et al.

[11] Patent Number: 5,036,377
[45] Date of Patent: Jul. 30, 1991

[54] TRIAC ARRAY

[75] Inventors: Vijay K. Pathak; David R. Cotton, both of Bedford, England

[73] Assignee: Texas Instruments Incorporated, Dallas, Tex.

[21] Appl. No.: 227,961

[22] Filed: Aug. 3, 1988

[51] Int. Cl.$^5$ .......................................... H01L 29/74
[52] U.S. Cl. .................................... 357/38; 357/23.4; 357/39; 307/632
[58] Field of Search .................. 357/38, 39, 23.4; 307/632

[56] References Cited

U.S. PATENT DOCUMENTS

| | | | |
|---|---|---|---|
| 3,784,886 | 1/1974 | Miyata et al. | 357/39 |
| 3,812,405 | 5/1974 | Clark | 357/39 |
| 3,971,056 | 7/1976 | Jaskolski et al. | 357/38 |
| 4,040,878 | 8/1977 | Rowe | 357/38 |
| 4,121,239 | 10/1978 | Berndes et al. | 357/39 |
| 4,157,562 | 6/1979 | D'Altroy et al. | 357/39 |
| 4,244,000 | 1/1981 | Ueda et al. | 357/38 |
| 4,246,594 | 1/1981 | Mori | 357/39 |
| 4,365,170 | 12/1982 | Okuhara | 357/38 |
| 4,612,561 | 9/1986 | Kimura et al. | 357/38 |
| 4,612,562 | 9/1986 | Motojima et al. | 357/38 |
| 4,641,175 | 2/1987 | Shiraishi | 357/39 |

FOREIGN PATENT DOCUMENTS

| | | | |
|---|---|---|---|
| 56-150862 | 11/1981 | Japan | 357/39 X |
| 58-176972 | 10/1983 | Japan | 357/39 |
| 61-53772 | 3/1986 | Japan | 357/38 |
| 1399644 | 7/1975 | United Kingdom | 357/39 C |
| 1171873 | 8/1985 | U.S.S.R. | 357/38 |

Primary Examiner—Rolf Hille
Assistant Examiner—Steven Loke
Attorney, Agent, or Firm—William E. Hiller; N. Rhys Merrett; Mel Sharp

[57] ABSTRACT

Thyristors of one conductivity type formed as an array in a first semiconductor body are respectively connected in parallel with thyristors of the opposite conductivity type formed as an array in a second semiconductor body to produce an array of triacs. In each body the thyristors are separate except for a common anode or cathode region and terminal connection, and are formed in an epitaxial layer divided by PN junction isolation regions on a substrate of opposite conductivity type. The thyristors may be constructed to be triggered by gating signals of either polarity.

8 Claims, 2 Drawing Sheets

TRIAC ARRAY

This invention relates to the fabrication of a semiconductor arrangement including a plurality of triacs.

In domestic appliances such as automatic washing machines and dish washing machines it is required to bring into operation in a particular sequence different electric motors and solenoid valves to execute a washing programme. At least some of these devices are operated by alternating current, possibly at the mains supply voltage. In many such machines the switching is performed by mechanical switches formed by leaf spring contacts operated by a set of cams. Mechanical switches are undesirable in that over an extended period of use they become unreliable due to dirt on the contacts, the contacts burning away or the springs breaking from fatigue of the metal.

In order to avoid this difficulty semiconductor switches have been used, which switches are usually triacs because they have to switch alternating current. The triacs could be provided as discrete components but it would obviously be cheaper and more convenient to have all the triacs required for a particular machine included in a single unit. In order to isolate one from another a number of triacs in a common semiconductor body, the conventional method is to form isolating diffusions of opposite conductivity type to the body from both front and back of the body so that they meet in the middle, thereby dividing the body in separate pockets each of which can contain one triac. This method has not proved economically practical because the long periods of time needed to produce such deep diffusions mean that the isolation regions become very wide and consequently a large proportion of the semiconductor body is not usable to accommodate the triacs.

It is an object of the present invention to provide an improved semiconductor arrangement including a plurality of triacs.

According to the present invention there is provided a semiconductor arrangement comprising a first semiconductor body of a first conductivity type having a first major surface in which a first array of thyristors are formed having a common electrode connection at the second major surface of the first body, the thyristors of the first array being controllably capable of passing current of one polarity to the common electrode connection, a second semiconductor body of a second conductivity type having a first major surface in which a second array of thyristors are formed having a common electrode connection at the second major surface of the second body, the thyristors of the second array being controllably capable of passing current of the opposite polarity to the one polarity to the common electrode connection, means joining the common electrode connection of the first array of thyristors to the common electrode connection of the second array of thyristors, and interconnection means connecting in parallel thyristors of the first array with corresponding thyristors of the second array to form an array of triacs each having a single gate connection.

In each semiconductor body the thyristors may be formed by regions in an epitaxial layer together with a substrate, the epitaxial layer being on the substrate which is of opposite conductivity type to the substrate. The epitaxial layer extends to the first major surface of the body and the substrate to the second major surface. The thyristors are separated one from the other by PN junctions formed by isolation regions of the same conductivity type as the substrate extending from the first major surface of the body to the substrate.

Either or both of the semiconductor bodies may additionally include other electronic components which may be used in control circuits for the thyristors. Such other components may be isolated from the thyristors on the same semiconductor body by isolation diffusions similar to those used to separate the thyristors from each other.

Although the invention requires two semiconductor bodies in place of the one used if the triacs are formed as units, the area of the semiconductor bodies needed for the isolation regions is reduced by up to a factor of three from that required on the single body because of the greatly reduced vertical diffusion distance. The power dissipation of an array of triacs according to the invention is reduced by a factor of up to five over the prior art for the same switching capability. The switching speeds of the triacs of an array according to the invention can be higher than triacs of prior art arrays because the voltage blocking regions of the thyristors, when connected to form triacs, can be made thinner than the corresponding layers of a triac as a monolithic device for the same working voltages.

Because the invention requires two separate semiconductor bodies charge interaction between the two thyristors forming a triac which could lead to spurious switching cannot occur. Moreover the cumulative heating effects are lower for a triac formed of two separate thyristors than for a monolithic device, because each thyristor can be conducting for half cycles of one polarity only of an a.c. supply and must be non-conducting for the other half cycles.

Since the common electrode connections of the two semiconductor bodies are connected together, the two bodies can conveniently be mounted on the same heat sink.

In order that the invention may be fully understood and readily carried into effect an example will now be described with reference to the accompanying drawings, of which:

Figure 3:
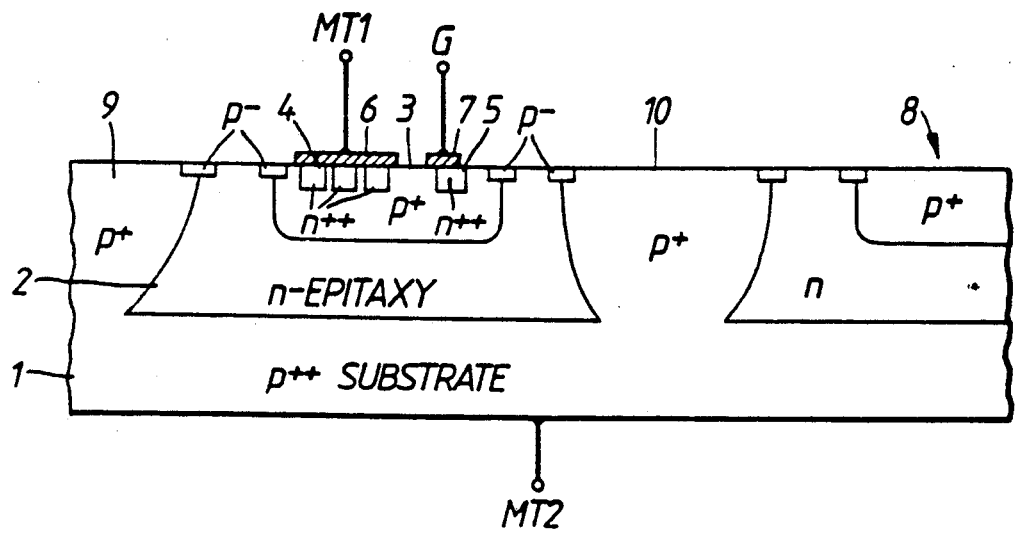
Figure 4:
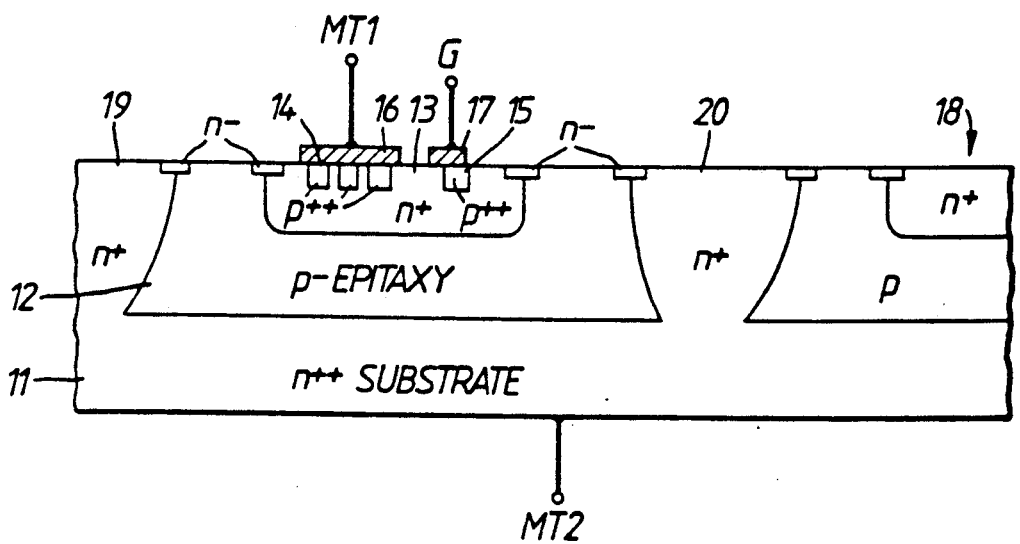

FIGS. 3 and 4 respectively show in diagrammatic form the cross-sections of the two types of thyristors used in the example.

Figure 1:
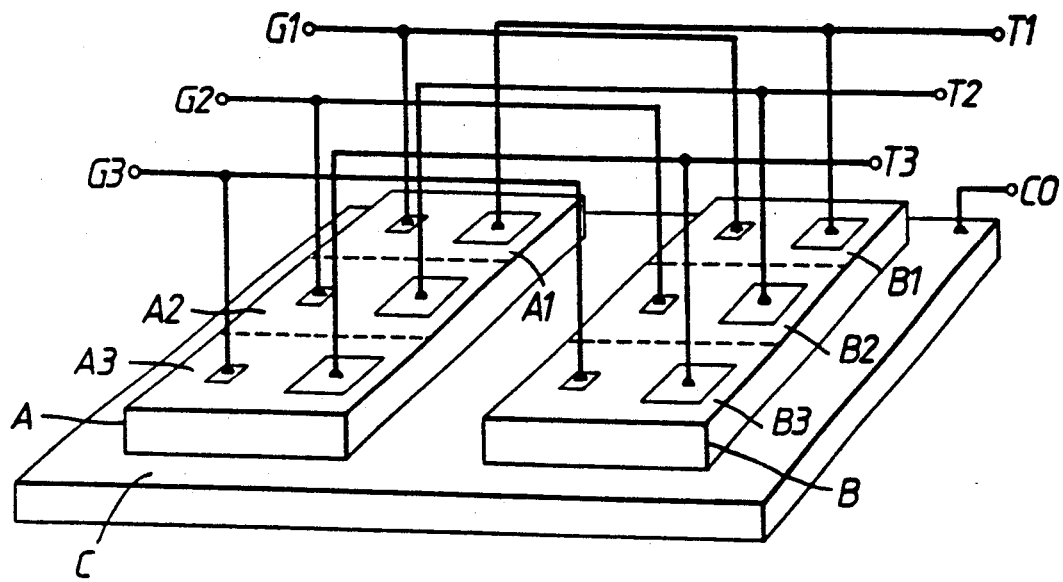
FIG. 1 is a diagram of the layout of the example of the invention.

The example shown in FIG. 1 includes two semiconductor bodies A, B, each including three thyristors A1, A2 A3 and B1, B2, B3. The semiconductor bodies are both mounted on an electrically and thermally conductive heat sink C. As will be described in more detail later, the thyristors in the body A are of the complementary conductivity type to those in the body B. The thyristors in the body A have a common cathode connection at the lower surface of the body and individual anode connections at the upper surface. The thyristors in the body B have a common anode connection at the lower surface of the body and individual cathode connections at the upper surface. Anodes of the thyristors A1, A2 and A3 are respectively connected to the cathodes of the thyristors B1, B2 and B3 and to terminals T1, T2 and T3. The gate terminals of the thyristors A1, A2 and A3 which are anode gated are respectively connected to the gate terminals of the thyristors B1, B2 and B3, which are cathode gated, and to gate terminals G1, G2 and G3. The common heat sink C is connected to an output terminal C0.

Figure 2:
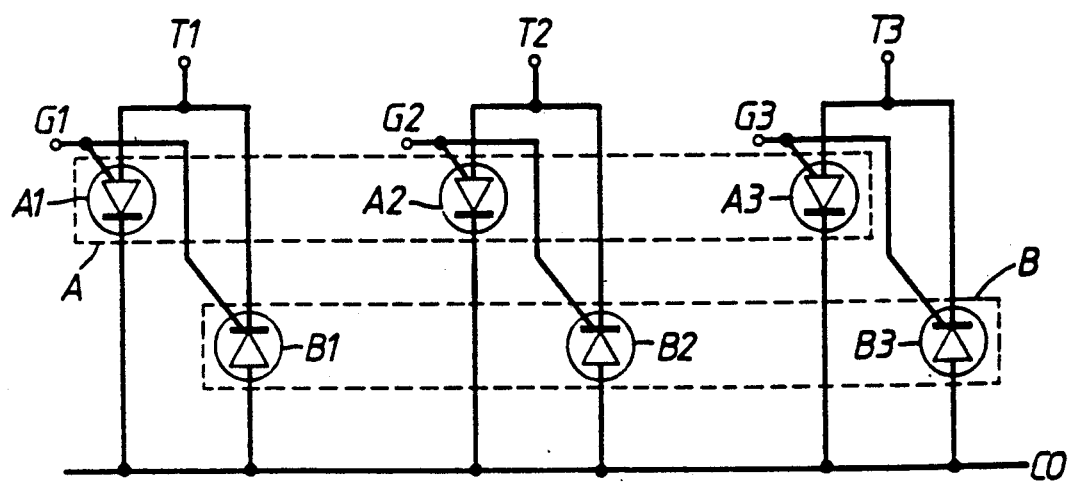
FIG. 2 is an electrical circuit diagram of the example shown in FIG. 1.

FIG. 2 is an electrical circuit diagram of the example shown in FIG. 1 and uses the same references as are used in that figure. The dotted line rectangles in FIG. 2 respectively represent the semiconductor bodies A and B shown in FIG. 1, making it clear that the thyristors A1, A2 and A3 are in the semiconductor body A and the thyristors B1, B2 and B3 are in the semiconductor body B.

From a consideration of FIG. 2, it will be apparent that the thyristors are connected in inverse parallel connection in pairs between a terminal T and the heat sink C and that each pair of thyristors has a common gate terminal G. As is well known, this configuration of two thyristors connected in inverse parallel connection operates as a controllable switch for alternating current in the same way as a triac. If no gate voltage is applied to the gate terminal G of a pair of thyristors then they are non-conducting and no current will flow through them in either direction. If, however, a gating signal is applied to the terminal G, then respective half cycles of the alternating current will be passed by the two thyristors so that the pair of them appears like a closed circuit connection between the terminal T and the heat sink C. In the particular example to he described later, the thyristors can be rendered conducting by a gating signal of either polarity.

FIGS. 3 and 4 are diagrammatic cross-sections of the two types of thyristors respectively. FIG. 3 represents the type of thyristors formed in the semiconductor body B and FIG. 4 represents the kind of thyristor formed in the body A.

The thyristor shown in FIG. 3 has its cathode contact connected to the upper terminal MT1 and its anode formed by a substrate 1 connected to the lower terminal MT2. On the upper surface of the substrate 1 is deposited an epitaxial layer 2 of N-type conductivity in which is formed a well 3 of P+-conductivity by chemical diffusion or preferably by ion implanted diffusion. A perforated region 4 of N++-conductivity is formed in the upper surface of the well 3 and a further region 5 also of N++-conductivity is formed near it. Metallisation 6 is formed over the region 4 and is connected to the terminal MT1. Metallisation 7 overlapping the edge of the region 5 is connected to the terminal G.

The structure just described constitutes a thyristor. It is isolated from other transistors formed in a similar manner on the same substrate part of one of which is indicate at 8, by isolation regions 9 and 10 of P+-conductivity which extend right through the thickness of the epitaxial layer 2 to reach the substrate 1. The thyristor is therefore contained in a pocket isolated from the other thyristors (and any other component formed on the substrate (1) by PN junction isolation.

In order to relieve the surface electric field distribution where the junctions meet the upper surface of the semiconductor body, a low impurity concentration of P-type material is applied by ion implanted diffusion to the surface after the thyristor structure and the isolating diffusions have been formed. This is shown in FIG. 3 as the small P−-regions where the PN junctions bounding the epitaxial layer meet the upper surface of the body. The effect of the relief of the surface electric field distribution is to enable the thyristor to withstand a higher reverse voltage than otherwise would be the case.

The perforations through the cathode region 4 serve to provide a resistive connection between the metallisation 6 an the main body of the well 3 so as to produce a resistive short across the PN junction between the well 3 and the region 4. The effect of this short on the operation of the thyristor is to set the latching current through the thyristor necessary to switch it into conduction. Since for conduction a forward potential of about 0.6 volts is required across the PN junction between the well 3 and the region 4, the latching current will be that current which when passing through the shorting resistance produces the required 0.6 volts forward bias.

The metallisation 7 connected to the terminal G overlaps the boundary of the region 5. The effect of this is to make the thyristor sensitive to gating signals of both positive and negative polarity. If the gating signal is of positive polarity it serves to raise the potential of the well 3 relative to the region 4 through the direct connection of the metallisation 7 to the surface of the well 3. If the gating signal is of negative polarity it serves to lower the potential of the region 5 relative to the well 3 and initiate conduction of the thyristor from the region 5 as a supplementary cathode. Once sufficient current is flowing through the thyristor the junction between the well 3 and the region 4 becomes forward biassed and conduction from the terminal MT1 begins.

Comparison of FIG. 4 with FIG. 3 will reveal that the structure shown in FIG. 4 is the same as that shown in FIG. 3, except that in every case the conductivity type has been reversed. In FIG. 4 reference numerals increased by 10 compared with those used in FIG. 3 are used for corresponding parts. It will be apparent that in the case of FIG. 4 the connection MT2 is the cathode connection of the thyristor and the terminal MT1 provides the anode connection.

Because the common connections of the thyristors in both semiconductor bodies are connected together, they can be connected directly to a common heat sink which may also provide the electrical connection between them. The a.c power circuitry will of course have to be arranged to permit the thyristors to be connected together through the common connection, for example by connecting either lead of the a.c. power supply to the common connection.

The control circuitry for the pairs of thyristors may be integrated into one or other or both of the semiconductor bodies.

Although a plurality of thyristors is provided in each semiconductor body, it is not necessary for the thyristors in a body to have the same holding and/or latching currents. As mentioned above, the holding and latching current of the thyristor is determined by the resistive shorts across the anode or cathode junction and modification of the arrangements of the shorting perforations through the anode/cathode regions can be used to adjust the resistive value of the shorts of the different thyristors formed by the same processes. The provision of a large number of small diameter perforations will produce a thyristor having a higher latching current than one with fewer perforations.

The separation of each triac into its component thyristors on separate semiconductor bodies has a number of advantages. Firstly, because each thyristor can be conducting for only one half of each a.c. cycle the cumulative heating effect on a semiconductor body is lower than for a monolithic triac, which means that an arrangement according to the invention will be more robust in handling current inrush due to overload condition. Another advantage of the separation of the two thyristors is that there can be no possibility of residual charge interaction between the two devices. A further advantage of the invention lies in the reduced number of connections necessary which leads to greater reliability of the circuit to which the triacs are connected.

The epitaxial layer in which the thyristors are formed would be between 75 to 100 microns thickness for 600 volt thyristors. The thyristors may be made with a current carrying capacity of from 25 milliamps to 3 amps. By forming the thyristor structure in the epitaxial layer the isolation PN junctions necessary to separate them one from another need only penetrate the epitaxial layer through to the substrate, which means that they can be relatively narrow and there is only a small amount of the area of the semiconductor wafer used in this way. Because the thyristors can be made thinner in the epitaxial layer than if they were formed by diffusion into the body of the semiconductor there are fewer losses of power due to the spreading of the current through the device. In addition, relieving of the surface electric field distribution as mentioned above helps to maintain a high voltage capability of the thyristors. Making use of the advantages provided by the invention in enabling smaller thyristors to be used and reducing the wafer area required for isolation regions an aggregate saving of up to two-thirds of the silicon wafer area is possible.

The thyristors used in the present invention may incorporate a buried region adjacent to the central junction as described in British Patent Specification No. 2,113,907. This buried region which would be of the same conductivity as the epitaxial layer but of higher impurity concentration enables the thyristors to have more precise control of the current through them by providing a preferred path for the current through the central junction.

Although the invention has been described with reference to a specific embodiment including only three thyristors in each semiconductor body, it will be obvious that other numbers of thyristors may be included in each body.

We claim:
1. A semiconductor arrangement comprising:
   first semiconductor body means having first and second major surfaces, said first semiconductor body means including at least a first semiconductor substrate of one conductivity type;
   a first array of thyristors defined in said first semiconductor body means and opening onto the first major surface thereof, said first array of thyristors having a common electrode connection at the second major surface of said first semiconductor body means;
   the thyristors of said first array of thyristors being controllably capable of passing current of one polarity to the common electrode connection at the second major surface of said first semiconductor body means;
   second semiconductor body means having first and second major surfaces and being independent of and spaced from said first semiconductor body means, said second semiconductor body means including at least a second semiconductor substrate of the other conductivity type;
   a second array of thyristors defined in said second semiconductor body means and opening onto the first major surface thereof, said second array of thyristors having a common electrode connection at the second major surface of said second semiconductor body means;
   the thyristors of said second array of thyristors being controllably capable of passing current of the other polarity to the common electrode connection at the second major surface of said second semiconductor body means;
   means joining the common electrode connection of said first array of thyristors to the common electrode connection of said second array of thyristors; and
   interconnection means connecting thyristors of said first array of thyristors in parallel with corresponding thyristors of said second array of thyristors to define an array of triacs, said interconnection means including a single gate connection respectively connecting the corresponding thyristors in said first and second arrays of thyristors for each respective one of said triacs included in said array of triacs.

2. A semiconductor arrangement as set forth in claim 1, wherein said first semiconductor body means further includes a first epitaxial layer of the other conductivity type disposed on said first semiconductor substrate of one conductivity type, said first epitaxial layer of the other conductivity type having a top surface defining said first major surface of said first semiconductor body means, and said first semiconductor substrate of one conductivity type having a bottom surface defining said second major surface of said first semiconductor body means;
   a first dopant region of one conductivity type disposed in said first epitaxial layer of the other conductivity type and opening onto the first major surface of said first semiconductor body means;
   a second dopant region of the other conductivity type disposed in said first dopant region of one conductivity type and opening onto the first major surface of said first semiconductor body means;
   each of said thyristors included in said first array of thyristors being formed by said first and said second dopant regions, said first epitaxial layer, and said first semiconductor substrate;
   said second semiconductor body means further including a second epitaxial layer of one conductivity type disposed on said second semiconductor substrate of the other conductivity type, said second epitaxial layer of one conductivity type having a top surface defining said first major surface of said second semiconductor body means, and said second semiconductor substrate of the other conductivity type having a bottom surface defining said second major surface of said second semiconductor body means;
   a first dopant region of the other conductivity type disposed in said second epitaxial layer of one conductivity type and opening onto the first major surface of said second semiconductor body means;
   a second dopant region of one conductivity type disposed in said first dopant region of the other conductivity type and opening onto the first major surface of said second semiconductor body means; and
   each of said thyristors included in said second array of thyristors being formed by said first and second dopant regions of said second semiconductor body means, said second epitaxial layer, and said second semiconductor substrate.

3. A semiconductor arrangement as set forth in claim 2, further including isolation regions of the same conductivity type as said semiconductor substrate formed in said epitaxial layer and extending from the first major surface through the epitaxial layer to said semiconductor substrate in each of said first and second semiconductor body means; and said isolation regions being interposed between adjacent thyristors included in the respective first and second arrays of thyristors defined in said first and second semiconductor body means to define respective PN junctions with the epitaxial layer in which said isolation regions are formed.

4. A semiconductor arrangement comprising:

a first semiconductor body including a first substrate of P-type conductivity having top and bottom surfaces, a first epitaxial layer of N-type conductivity disposed on the top surface of said first substrate, the top surface of said first epitaxial layer defining a first major surface of said first semiconductor body and the bottom surface of said first substrate defining a second major surface of said first semiconductor body, first isolation region means of P-type conductivity extending through said first epitaxial layer and dividing said first epitaxial layer into a plurality of separate N-type epitaxial regions, a first P-type gate region disposed in each of said separate N-type epitaxial regions and opening onto the first major surface of said first semiconductor body, a second N-type cathode region disposed in said first, P-type gate region and opening onto the first major surface of said first semiconductor body, and said first P-type gate region, said second N-type cathode region, each said N-type epitaxial region and said first substrate of P-type conductivity defining respective thyristors to provide a first array of thyristors defined in said first semiconductor body and having a common electrode provided by said first substrate;

a second semiconductor body independent of and spaced from said first semiconductor body, said second semiconductor body including a second substrate of N-type conductivity having top and bottom surfaces, a second epitaxial layer of P-type conductivity disposed on the top surface of said second substrate, the top surface of said second epitaxial layer defining a first major surface of said second semiconductor body and the bottom surface of said second substrate defining a second major surface of said second semiconductor body, second isolation region means of N-type conductivity extending through said second epitaxial layer and dividing said second epitaxial layer into a plurality of separate P-type epitaxial regions, a first N-type gate region disposed in each of said separate P-type epitaxial regions and opening onto the first major surface of said second semiconductor body, a second P-type anode region disposed in said first N-type gate region and opening onto the first major surface of said second semiconductor body, and said first N-type gate region, said second P-type anode region, each said P-type epitaxial region and said second substrate of N-type conductivity defining respective thyristors to provide a second array of thyristors defined in said second semiconductor body and having a common electrode provided by said second substrate;

first connection means joining the second major surfaces of said first and second semiconductor bodies as defined by the bottom surfaces of said first and second substrates;

a plurality of second connection means respectively joining each P-type gate region in each of said separate N-type epitaxial regions of said first epitaxial layer to a corresponding N-type gate region in each of said separate P-type epitaxial regions of said second epitaxial layer; and a plurality of third connection means respectively connecting each N-type cathode region to a corresponding P-type anode region.

5. A semiconductor arrangement as set forth in claim 4, further including a heat sink; and each of said first and second semiconductor bodies being mounted on said heat sink and having the second major surfaces thereof as provided by the bottom surfaces of said first and second substrates in engagement with said heat sink.

6. A semiconductor arrangement as set forth in claim 5, wherein said heat sink connects the common electrode of said first array of thyristors as provided by said first substrate to the common electrode of said second array of thyristors as provided by said second substrate.

7. A semiconductor arrangement as set forth in claim 4, wherein said cathode and anode regions defining the respective said second regions in said first regions of the corresponding first and second epitaxial layers are penetrated by material of the corresponding first regions extending to the first major surface of the respective first and second semiconductor bodies; and respective cathode and anode terminal metal layers disposed on the respective first major surfaces of said first and second semiconductor bodies in engagement with the corresponding cathode and anode regions provided by said second regions and the portions of the corresponding first regions penetrating said second regions.

8. A semiconductor arrangement as set forth in claim 4, wherein each of said first P-type gate regions in each of said separate N-type epitaxial regions includes an additional N-type region disposed therein;

each of said first N-type gate regions in each of said separate P-type epitaxial regions includes an additional P-type region disposed therein; and each of said plurality of second connection means being connected to a P-type gate region and the additional N-type region provided therein and to an N-type gate region and the additional P-type region provided therein.

* * * * *